US006670082B2

(12) United States Patent
Liu et al.

(10) Patent No.: US 6,670,082 B2
(45) Date of Patent: Dec. 30, 2003

(54) SYSTEM AND METHOD FOR CORRECTING 3D EFFECTS IN AN ALTERNATING PHASE-SHIFTING MASK

(75) Inventors: Yong Liu, Fremont, CA (US); Hua-Yu Liu, Palo Alto, CA (US)

(73) Assignee: Numerical Technologies, Inc., Mountain View, CA (US)

( * ) Notice: Subject to any disclaimer, the term of this patent is extended or adjusted under 35 U.S.C. 154(b) by 212 days.

(21) Appl. No.: 09/974,507

(22) Filed: Oct. 9, 2001

(65) Prior Publication Data
US 2003/0068564 A1 Apr. 10, 2003

(51) Int. Cl.[7] ............................. G03F 9/00; G06F 17/50
(52) U.S. Cl. ............................................. 430/5; 716/19
(58) Field of Search ............................ 430/5, 30, 394; 716/19, 20, 21; 355/53

(56) References Cited

U.S. PATENT DOCUMENTS

| 4,231,811 A | 11/1980 | Somekh et al. ............... 148/1.5 |
| 4,426,584 A | 1/1984 | Bohlen et al. ............ 250/492.2 |
| 4,456,371 A | 6/1984 | Lin ............................... 355/71 |
| 4,812,962 A | 3/1989 | Witt ............................. 364/490 |
| 4,895,780 A | 1/1990 | Nissan-Cohen et al. ........ 430/5 |
| 4,902,899 A | 2/1990 | Lin et al. .................. 250/492.1 |
| 5,051,598 A | 9/1991 | Ashton et al. ............ 250/492.2 |
| 5,182,718 A | 1/1993 | Harafuji et al. .............. 364/490 |
| 5,208,124 A | 5/1993 | Sporon-Fiedler et al. ....... 430/5 |
| 5,498,579 A | 3/1996 | Borodovsky et al. ........ 437/250 |
| 5,553,273 A | 9/1996 | Liebmann .................... 395/500 |

(List continued on next page.)

FOREIGN PATENT DOCUMENTS

| GB | 2324169 A | 10/1998 |
| JP | 3-80525 | 4/1991 |
| JP | 3-210560 | 9/1991 |
| JP | 8-236317 | 9/1996 |
| JP | 10-133356 | 5/1998 |
| JP | 11-143085 | 5/1999 |
| WO | WO 99/14706 A2 A3 | 3/1999 |
| WO | WO 99/47981 | 9/1999 |
| WO | WO 00/36525 A2 | 6/2000 |
| WO | WO 00/67074 A1 | 11/2000 |
| WO | WO 00/67075 A1 | 11/2000 |
| WO | WO 00/67076 A1 | 11/2000 |

OTHER PUBLICATIONS

Ackmann, P., et al., "Phase Shifting and Optical Proximity Corrections CD Control on Logic Devices in Manufacturing for Sub 0.35 um I–Line", Advance Micro Devices (8 pages).
Chen, J.F., et al., "Optical Proximity Correction for Intermediate–Pitch Features Using Sub–Resolution Scattering Bars", MicroUnity Systems Engineering, Inc., Sunnyvale, California, pp. 1–16.
Chen, J.F., et al., "Practical Method for Full–Chip Optical Proximity Correction", MicroUtility Systems Engineering, Inc., Sunnyvale, California (14 pages).
Cobb, et al., "Fast Sparse Aerial Image Calculation for OPC", SPIE, vol. 2621, pp. 534–544.

(List continued on next page.)

Primary Examiner—S. Rosasco
(74) Attorney, Agent, or Firm—Bever, Hoffman & Harms, LLP; Jeanette S. Harms

(57) ABSTRACT

An accurate, cost-effective system and method for correcting 3D effects on an alternating phase-shifting mask (PSM) is provided. To facilitate this correction, a library can be built to include a first group of 180 degree phase-shifting regions, wherein these regions have a common first size. Based on this first size, 3D simulation is performed. A transmission and a phase are altered in a 2D simulation based on this first size until a shape dependent transmission and a shape dependent phase allow the 2D simulation to substantially match the 3D simulation. Finally, a modified first size is chosen using the shape dependent transmission and the shape dependent phase such that a 2D simulation based on the modified first size substantially matches the 3D simulation based on the first size. The library associates the first size with the modified first size, the shape dependent transmission, and the shape dependent phase.

24 Claims, 8 Drawing Sheets

U.S. PATENT DOCUMENTS

| | | | |
|---|---|---|---|
| 5,241,185 A | 8/1993 | Meiri et al. | 250/492.2 |
| 5,242,770 A | 9/1993 | Chen et al. | 430/5 |
| 5,256,505 A | 10/1993 | Chen et al. | 430/5 |
| 5,282,140 A | 1/1994 | Tazawa et al. | 364/468 |
| 5,326,659 A | 7/1994 | Liu et al. | 430/5 |
| 5,340,700 A | 8/1994 | Chen et al. | 430/312 |
| 5,432,714 A | 7/1995 | Chung et al. | 364/525 |
| 5,447,810 A | 9/1995 | Chen et al. | 430/5 |
| 5,553,274 A | 9/1996 | Liebmann | 395/500 |
| 5,572,598 A | 11/1996 | Wihl et al. | 382/144 |
| 5,631,110 A | 5/1997 | Shioiri et al. | 430/5 |
| 5,636,002 A | 6/1997 | Garofalo | 355/53 |
| 5,657,235 A | 8/1997 | Liebmann et al. | 364/474.24 |
| 5,663,017 A | 9/1997 | Schinella et al. | 430/5 |
| 5,663,893 A | 9/1997 | Wampler et al. | 364/491 |
| 5,682,323 A | 10/1997 | Pasch et al. | 364/491 |
| 5,705,301 A | 1/1998 | Garza et al. | 430/5 |
| 5,707,765 A | 1/1998 | Chen | 430/5 |
| 5,723,233 A | 3/1998 | Garza et al. | 430/5 |
| 5,740,068 A | 4/1998 | Liebmann et al. | 364/489 |
| 5,766,806 A | 6/1998 | Spence | 430/5 |
| 5,795,688 A | 8/1998 | Burdorf et al. | 430/30 |
| 5,801,954 A | 9/1998 | Le et al. | 364/488 |
| 5,804,340 A | 9/1998 | Garza et al. | 430/5 |
| 5,815,685 A | 9/1998 | Kamon | 395/500 |
| 5,821,014 A | 10/1998 | Chen et al. | 430/5 |
| 5,825,647 A | 10/1998 | Tsudaka | 364/167.03 |
| 5,827,623 A | 10/1998 | Ishida et al. | 430/5 |
| 5,847,959 A | 12/1998 | Veneklasen et al. | 364/468.28 |
| 5,862,058 A | 1/1999 | Samuels et al. | 364/491 |
| 5,863,682 A | 1/1999 | Abe et al. | 430/30 |
| 5,879,844 A | 3/1999 | Yamamoto et al. | 430/30 |
| 5,885,734 A | 3/1999 | Pierrat et al. | 430/5 |
| 5,900,338 A | 5/1999 | Garza et al. | 430/5 |
| 5,958,635 A | 9/1999 | Reich et al. | 430/30 |
| 5,972,541 A | 10/1999 | Sugasawara et al. | 430/5 |
| 5,991,006 A | 11/1999 | Tsudaka | 355/53 |
| 5,994,002 A | 11/1999 | Matsuoka | 430/5 |
| 6,007,310 A | 12/1999 | Jacobsen et al. | 417/362 |
| 6,009,250 A | 12/1999 | Ho et al. | 395/500.06 |
| 6,009,251 A | 12/1999 | Ho et al. | 395/500.06 |
| 6,011,911 A | 1/2000 | Ho et al. | 395/500.06 |
| 6,014,456 A | 1/2000 | Tsudaka | 382/144 |
| 6,016,357 A | 1/2000 | Neary et al. | 382/144 |
| 6,077,310 A | 6/2000 | Yamamoto et al. | 716/19 |
| 6,078,738 A | 6/2000 | Garza et al. | 395/500.22 |
| 6,081,658 A | 6/2000 | Rieger et al. | 395/500.22 |
| 6,081,659 A | 6/2000 | Garza et al. | 395/500.22 |
| 6,091,845 A | 7/2000 | Pierrat et al. | 382/144 |
| 6,114,071 A | 9/2000 | Chen et al. | 430/5 |
| 6,154,563 A | 11/2000 | Tsudaka | 382/144 |
| 6,171,731 B1 | 1/2001 | Medvedeva et al. | 430/5 |
| 6,183,916 B1 * | 2/2001 | Kuo et al. | 430/5 |
| 6,225,025 B1 | 5/2001 | Hoshino | 430/296 |
| 6,243,855 B1 | 6/2001 | Kobayashi et al. | 716/19 |
| 6,249,597 B1 | 6/2001 | Tsudaka | 382/144 |
| 6,272,236 B1 | 8/2001 | Pierrat et al. | 382/144 |
| 6,289,499 B1 | 9/2001 | Rieger et al. | 716/21 |
| 6,298,473 B1 | 10/2001 | Ono et al. | 716/21 |
| 6,339,836 B1 | 1/2002 | Eisenhofer et al. | 716/5 |
| 6,425,117 B1 * | 7/2002 | Pasch et al. | 716/21 |
| 6,453,457 B1 | 9/2002 | Pierrat et al. | 716/19 |
| 2002/0019729 A1 | 2/2002 | Chang et al. | 703/6 |
| 2002/0035461 A1 | 3/2002 | Chang et al. | 703/13 |
| 2002/0076622 A1 | 6/2002 | Pierrat et al. | 430/5 |
| 2002/0100004 A1 | 7/2002 | Pierrat et al. | 716/5 |

OTHER PUBLICATIONS

Lithas, "Lithas: Optical Proximity Correction Software" (2 pages).

Microunity, "OPC Technology & Product Description", MicroUnity Systems Engineering, Inc., pp. 1–5.

Precim, "Proxima System", Precim Company, Portland, Oregon (2 pages).

Precim, "Proxima Wafer Proximity Correction System", Precim Company, Portland, Oregon (2 pages).

Rieger, M., et al., "Mask Fabrication Rules for Proximity–Corrected Patterns", Precim Company, Portland, Oregon (10 pages).

Rieger, M., et al., "Using Behavior Modeling for Proximity Correction", Precim Company, Portland, Oregon (6 pages).

Stirniman, J., et al., "Spatial Filter Models to Describe IC Lithographic Behavior", Pattern Corporation, Portland, Oregon (10 pages).

Choi, Y., et al., "Optical Proximity Correction on Attenuated Phase Shifting Photo Mask for Dense Contact Assay", LG Semicon Company (11 pages).

Lucas, K., et al., "Model Based OPC for 1st Generation 193nm Lithography", Motorola Inc., IDT assignee to IMEC (12 pages).

Stirniman, J., et al., "Quantifying Proximity and Related Effects in Advanced Wafer Processes", Precim Company, Hewlett Packard Labs (9 pages).

Sugawara, M., et al., "Practical Evaluation of Optical Proximity Effect Correction by EDM Methodology", Sony Corporation (11 pages).

Granik, Y., et al., "MEEF as a Matrix", Mentor Graphics Corporation (11 pages).

Kang, D., et al., "Effects of Mask Bias on the Mask Enhancement Factor (MEEF) of Contact Holes" (11 pages).

Matsuura, S., et al., "Reduction of Mask Error Enhancement Factor (MEEF) by the Optimum Exposure Dose Self–Adjusted Mask", NEC Corporation (12 pages).

Adam, K., et al., "Simplified Models for Edge Transitions in Rigorous Mask Modeling", University of California Berkeley (40 pages).

Gordon, R., et al., "Mask Topography Simulation for EUV Lithography", FINLE Technologies Inc. (15 pages).

Pistor, T., "Rigorous 3D Simulation of Phase Defects in Alternating Phase–Shifting Masks", Panoramic Technology Inc. (13 pages).

Semmier, A., et al., "Application of 3D EMF Simulation for Development and Optimization of Alternating Phase Shifting Masks", Infineon Technologies AG (12 pages).

Wong, A., et al., "Polarization Effects in Mask Transmission", University of California Berkeley (8 pages).

Neureuther, A., et al., "Modeling Defect–Feature Interactions in the Presence of Aberrations", University of California Berkeley (10 pages).

Trans Vector, "Now Better Quality Photomasks", Trans Vector Technologies, Inc., Camarillo, California (4 pages).

Saleh, B., et al., "Reduction of Errors of Microphotographic Reproductions by Optimal Corrections of Original Masks", Optical Engineering, vol. 20, No. 5, pp. 781–784, Sep./Oct. 1981.

Mathur, B.P., et al., "Quantitative Evaluation of Shape of Image on Photoresist of Square Apertures", IEEE, Transactions On Electron Devices, vol. 35, No. 3, pp. 294–297, Mar. 1988.

Lin, B.J., "Methods to Print Optical Images at Low–k1 Factors", SPIE, Optical/Laser Microlithography III, vol. 1264, pp. 2–13 (1990).

Henke, W., et al., "A Study of Reticle Defects Imaged Into Three–Dimensional Developed Profiles of Positive Photoresist Using the Solid Lithography Simulator", Microelectronics Eng., vol. 14, pp. 283–297 (1991).

Wiley, J., et al., "Phase Shift Mask Pattern Accuracy Requirements and Inspection Technology", SPIE, Integrated Circuit Metrology, Inspection, And Process Control V, vol. 1464, pp. 346–355 (1991).

Fu, C.C., et al., "Enhancement of Lithographic Patterns by Using Serif Features", IEEE, Transactions On Electron Devices, vol. 38, No. 12, pp. 2599–2603, Dec. 1991.

Ohtsuka, H., et al., "Phase Defect Repair Method for Alternating Phase Shift Masks Conjugate Twin–Shifter Method", Jpn. J. Appl. Phys., vol. 31, pp. 4143–4149 (1992).

Crisalle, O., et al., "A Comparison of the Optical Projection Lithography Simulators in Sample and Prolith", IEEE, Transactions On Semiconductor Manufacturing, vol. 5, No. 1, pp. 14–26, Feb. 1992.

Garofalo, J., et al., "Mask Assisted Off–Axis Illumination Technique for Random Logic", J. Vac. Sci. Technol. B, vol. 11, No. 6, pp. 2651–2658, Nov./Dec. 1993.

Harafuji, K., et al., "A Novel Hierarchical Approach for Proximity Effect Correction in Electron Beam Lithography", IEEE, vol. 12, No. 10, pp. 1508–1514, Oct. 1993.

Nistler, J., et al., "Phase Shift Mask Defect Printability Analysis", Proceedings Of The Microlithography Seminar Interface '93, OCG Microelectronic Materials, Inc., pp. 11–28 (1993).

Rieger, M., et al., "System for Lithography Proximity Compensation", Precim Company, Portland, Oregon, Sep. 1993 (28 pages).

Garofalo, J., et al., "Automatic Proximity Correction for 0.35um I–Line Photolithography", IEEE, pp. 92–94 (1994).

Pati, Y.C., et al., "Phase–Shifting Masks for Microlithography: Automated Design and Mask Requirements", J. Opt. Soc. Am., vol. 11, No. 9, pp. 2438–2452, Sep. 1994.

Pierrat, C., et al., "A Rule–Based Approach to E–Beam and Process–Induced Proximity Effect Correction for Phase–Shifting Mask Fabrication", SPIE, vol. 2194, pp. 298–309 (1994).

Spence, C., et al., "Automated Determination of CAD Layout Failures Through Focus: Experiment and Simulation", SPIE, vol. 2197, pp. 302–313 (1994).

Stirniman, J., et al., "Fast Proximity Correction with Zone Sampling", SPIE, vol. 2197, pp. 294–301 (1994).

Stirniman, J., et al., "Optimizing Proximity Correction for Wafer Fabrication Processes", SPIE, Photomask Technology And Management, vol. 2322, pp. 239–246 (1994).

Stirniman, J., et al., "Wafer Proximity Correction and Its Impact on Mask–Making", Bacus News, vol. 10, Issue 1, pp. 1, 3–7, 10–12, Jan. 1994.

Qian, Q.D., et al., "A New Scalar Planewave Model for High NA Lithography Simulations", IEEE, pp. 45–48 (1994).

Henderson, R., et al., "Optical Proximity Effect Correcion: An Emerging Technology", Microlithography World, pp. 6–12 (1994).

Barouch, E., et al., "Optimask: An OPC Algorithm for Chrome and Phase–Shift Mask Design", SPIE, Vo. 2440, pp. 192–206, Feb. 1995.

Garofalo, J., et al., "Automated Layout of Mask Assist–Features for Realizing 0.5k1 ASIC Lithography", SPIE, vol. 2440, pp. 302–312 (1995).

Karklin, L., "A Comprehensive Simulation Study of the Photomask Defects Printability", SPIE, vol. 2621, pp. 490–504 (1995).

Wiley, J., et al., "The Effect of Off–Axis Illumination on the Printability of Opaque and Transparent Reticle Defects", SPIE, vol. 2512, pp. 432–440 (1995).

Brunner, T., et al., "Approximate Models for Resist Processing Effects", SPIE, vol. 2726, pp. 198–207, Mar. 1996.

Rieger, M., et al., "Customizing Proximity Correction for Process–Specific Objectives", SPIE, vol. 2726, pp. 651–659 (1996).

Yen, A., et al., "Characterization and Correction of Optical Proximity Effects in Deep–Ultraviolet Lithography Using Behavior Modeling", J. Vac. Sci. Technol. B, vol. 14, No. 6, pp. 4175–4178, Nov./Dec. 1996.

Chang, K., et al., "Accurate Modeling of Deep Submicron Interconnect Technology", TMA Times, vol. IX, No. 3 (1997).

Chen, J.F., et al., "Full–Chip Optical Proximity Correction with Depth of Focus Enhancement", Microlithography World (1997).

Gans, F., et al., "Printability and Repair Techniques for DUV Photomasks", SPIE, Proceedings Of The 17th Annual Symposium On Photomask Technology And Management, vol. 3236, pp. 136–141 (1997).

Ibsen, K., et al., "Clear Field Reticle Defect Diposition for Advanced Sub–Half Micron Lithography", SPIE, Proceedings Of The 17th Annual Symposium On Photomask Technology And Management, vol. 3236, pp. 124–135 (1997).

Morimoto, H., et al., "Next Generation Mask Strategy— Technologies are Ready for Mass Production of 256MDRAM?", SPIE, vol. 3236, pp. 188–189 (1997).

Park, C., et al., "An Automatic Gate CD Control for a Full Chip Scale SRAM Device", SPIE, vol. 3236, pp. 350–357 (1997).

Pati, Y.C., et al., "Exploiting Structure in Fast Image Computation for Integrated Circuit Patterns", IEEE Transactions On Semiconductor Manufacturing, vol. 10, No. 1, pp. 62–74, Feb. 1997.

Vacca, A., et al., "100nm Defect Detection Using a Dynamically Programmable Image Processing Algorithm", SPIE, vol. 3236 (1997) (Abstract Only).

Dolainsky, C., et al., "Application of a Simple Resist Model to Fast Optical Proximity Correction", SPIE, vol. 3051, pp. 774–780 (1997).

Chen, J., et al., "Full–Chip Optical Proximity Correction with Depth of Focus Enhancement", Microlithography World, (5 pages) (1997).

Asai, N., et al., "Proposal for the Coma Aberration Dependent Overlay Error Compensation Technology", Jpn. J. Appl. Phys., vol. 37, pp. 6718–6722 (1998).

Gotoh, Y., et al., "Pattern Dependent Alignment Technique for Mix–and–Match Electron–Beam Lithography with Optical Lithography", J. Vac. Sci. Technol. B, vol. 16, No. 6, pp. 3202–3205, Nov./Dec. 1998.

Kubota, H., et al., "A Fast Method of Simulating Resist Pattern Contours Based on Mean Inhibitor Concentration", Jpn. J. Appl. Phys., vol. 37, pp. 5815–5820 (1998).

Vacca, A., et al., "100nm Defect Detection Using an Existing Image Acquisition System", SPIE, vol. 3236, pp. 208–221 (1998).

Wong, A., et al., "Lithographic Effects of Mask Critical Dimension Error", SPIE, vol. 3332, pp. 106–115 (1998).

Fukuda, H., et al., "Determination of High–Order Lens Aberration Using Phase/Amplitude Linear Algebra", J. Vac. Sci. Technol. B, vol. 17, No. 6, pp. 3318–3321, Nov./Dec. 1999.

Fukuda, H., "Node–Connection/Quantum Phase–Shifting Mask: Path to Below 0.3um Pitch, Proximity Effect Free, Random Interconnects and Memory Patterning", J. Vac. Sci. Technol. B, vol. 17, No. 6, pp. 3291–3295, Nov./Dec. 1999.

Spence, C., et al., "Integration of Optical Proximity Correction Strategies in Strong Phase Shifters Design for Poly–Gate Layers", Bacus News, vol. 15, Issue 12, pp. 1, 4–13, Dec. 1999.

Balasinski, A., et al., "A Novel Approach to Simulate the Effect of Optical Proximity on MOSFET Parametric Yield", IEEE, pp. 37.6.1–37.6.4 (1999).

Balasinki, A., et al., "Comparison of Mask Writing Tools and Mask Simulations for 0.16um Devices", IEEE, SEMI Advanced Semiconductor Manufacturing Conference, pp. 372–377 (1999).

Wong, A., et al., "Asymmetric Biasing for Subgrid Pattern Adjustment", SPIE, vol. 4346, pp. 1–6 (2001).

Erdmann, A., "Topography Effects and Wave Aberrations in Advanced PSM–Technology", Fraunhofer Institute of Integrated Circuits (11 pages).

Toublan, O., et al., "Phase and Transmission Errors Aware OPC Solution for PSM: Feasibility Demonstration", Mentor Graphics Corp. (7 pages).

Neureuther, A., "Modeling Phase Shifting Masks", SPIE, 10th Annual Symposium On Microlithography, vol. 1496, pp. 80–85 (1990).

Brunner, T., "Impact of Lens Aberrations on Optical Lithography", IBM J. Res. Develop., vol. 41, No. 1/2, pp. 57–67, Jan./Mar. 1997.

Tsujimoto, E., et al., "Hierarchical Mask Data Design System (Prophet) for Aerial Image Simulation, Automatic Phase–Shifter Placement, and Subpeak Overlap Checking", SPIE, vol. 3096, pp. 163–172 (1997).

Schoemaker, W., et al., "Theory and Implementation of a New Interpolation Method Based on Random Sampling", IMEC Technology Paper, pp. 1–35, Jan. 31, 1997.

Chuang, H., et al., "Practical Applications of 2–D Optical Proximity Corrections for Enhanced Performance of 0.25um Random Logic Devices", IEEE, pp. 18.7.1–18.7.4, Dec. 1997.

Cobb, N., et al., "Fast, Low–Complexity Mask Design", SPIE, vol. 2440, pp. 313–327, Feb. 22–24, 1995.

Cobb, N., et al., "Experimental Results on Optical Proximity Correction With Variate Threshold Resist Model", SPIE, vol. 3051, pp. 458–468, Mar. 12–14, 1997.

Cobb, N., "Fast Optical and Process Proximity Correction Algorithms for Integrated Circuit Manufacturing", Dissertation, University of California at Berkeley, UMI Microform 9902038 (139 pages).

Uhring, W., et al., "Model of an Instrumented Opto–Electronic Transmission System in HDL–A and VHDL–AMS", SPIE, vol. 3893, pp. 137–146. Oct. 1999.

Cooke, M., "OPC/PSM Designs For Poly Gate Layers", European Semiconductor, vol. 22, No. 7, pp. 57–59, Jul. 2000.

Granik, Y., et al., "Sub–Resolution Process Windows And Yield Estimation Technique Based On Detailed Full–Chip CD Simulation", SPIE, vol. 4182, pp. 335–341 (2000).

Schellenberg, F., et al., "OPC Beyond 0.18UM: OPC on PSM Gates", SPIE, vol. 4000, pp. 1062–1069. Mar. 1–3, 2000.

Toublan, O., et al., "Phase Aware Proximity Correction for Advanced Masks", SPIE, vol. 4000, pp. 160–170, Mar. 1–3, 2000.

* cited by examiner

SYSTEM AND METHOD FOR CORRECTING 3D EFFECTS IN AN ALTERNATING PHASE-SHIFTING MASK

BACKGROUND OF THE INVENTION

1. Field of the Invention

This invention relates to the field of alternating phase-shifting masks, and in particular to a method of correcting three-dimensional (3D) effects in alternating phase-shifting masks using two-dimensional (2D) analysis.

2. Description of Related Art

To fabricate an integrated circuit (IC), a physical representation of the features of the IC, e.g. a layout, is transferred onto a plurality of masks. The features make up the individual components of the circuit, such as gate electrodes, field oxidation regions, diffusion regions, metal interconnections, and so on. A mask is generally created for each layer of the IC. To create a mask, the data representing the layout for a corresponding IC layer can be input into a device, such as an electron beam machine, which writes IC features onto the mask. Once a mask has been created, the pattern on the mask can be transferred onto the wafer surface using a lithographic process.

Lithography is a process whose input is a mask and whose output includes the printed patterns on a wafer. As printed patterns on the IC become more complex, a need arises to decrease the feature size. However, as feature sizes shrink, the resolution limits of current optical-based lithographic systems are approached. Specifically, a lithographic mask includes clear regions and opaque regions, wherein the pattern of these two regions defines the features of a particular semiconductor layer. Under exposure conditions, diffraction effects at the transition of the transparent regions to the opaque regions can render these edges indistinct, thereby adversely affecting the resolution of the lithographic process.

Various techniques have been proposed to improve this resolution. One such technique, phase-shifting, uses phase destructive interference of the waves of incident light. Specifically, phase-shifting shifts the phase of a first region of incident light waves approximately 180 degrees relative to a second, adjacent region of incident light waves. In this manner, the projected images from these two regions destructively interfere where their edges overlap, thereby improving feature delineation and allowing greater feature density on the IC. A mask that uses such techniques is called a phase-shifting mask (PSM).

In one type of PSM, called an alternating (aperture) PSM, apertures between closely spaced features are processed so that light passing through any aperture is 180 degrees out of phase from the light passing through an adjacent aperture. FIGS. 1A and 1B illustrate one embodiment of an alternating PSM 100 including closely spaced opaque (e.g. chrome or some other absorbing material) features 101, 102, 103, and 104 formed on a transparent, e.g. quartz, substrate 105. Thus, apertures 106, 107, and 108 are formed between features 101–104.

To provide the phase-shifting in this embodiment, the areas of substrate 105 under alternating apertures can be etched, thereby causing the desired 180 degree phase shift. For example, substrate 105 can be etched in the area defined by aperture 107 to a predetermined depth. In this manner, the phase shift of light passing through aperture 107 relative to light passing through apertures 106 and 108 is approximately 180 degrees.

Unfortunately, the use of a PSM can introduce an intensity imbalance problem. FIG. 1C illustrates a graph 130 that plots intensity (0 to 1.0) versus position on alternating PSM 100. In graph 130, waveforms 131 that are shown nearing 1.0 intensity correspond to apertures 106 and 108, whereas waveform 132 that is shown at approximately 0.84 intensity corresponds to aperture 107. The intensity imbalance between the 180 degree phase-shifting region (i.e. aperture 107) and the 0 degree phase-shifting regions (i.e. apertures 106 and 108) is caused by the trench cut into substrate 105, thereby causing diffraction in the corners of aperture 107 and degrading the intensity of the corresponding waveform. This industry-recognized diffraction effect is called a three-dimensional (3D) effect.

Intensity imbalance can adversely affect printing features and overlay on the wafer. Typically, a feature on a binary mask has a pair of corresponding phase-shifting regions on a PSM. For example, referring to FIG. 1D, a feature 140 can have a corresponding 0 degree phase-shifting region 141 placed relative to one side of feature 140 and a corresponding 180 degree phase-shifting region 142 placed relative to the other side of feature 140. Of interest, if phase-shifting regions 141 and 142 are the same size, the electric field associated with region 141 is stronger than the electric field associated with region 142, thereby resulting in the maximum interference of these fields to occur to the right of centerline 143 on feature 140. Thus, under these conditions, feature 140 will actually print on the wafer to the right of the desired location as shown by feature 150 and its associated centerline 153.

Moreover, any defocus in the system can exacerbate the 3D effect and cause significant deviation from desired feature placement on the wafer. Because any wafer production line requires at least some acceptable range of defocus, e.g. typically within 0.4 microns, feature placement is frequently adversely affected when using alternating PSM. Therefore, those in the industry have proposed various methods to address the intensity imbalance problem.

In one proposed method shown in FIG. 1E, an additional etching step can be performed on substrate 105, thereby providing an under-cut etch 160 of features 101–104. Under-cut etch 160 increases the intensity by attempting to localize the diffraction effects under features 101–104. Unfortunately, under-cut etch 160 can also create mechanical instability of features 101–104 on the mask. In fact, the more the diffraction effects are localized, the greater the probability of mechanical instability during subsequent processing steps, such as mask cleaning. Thus, under-cut etch 160 provides an incomplete solution with the potential of causing complete mask failure.

SUMMARY OF THE INVENTION

In accordance with one feature of the present invention, an accurate, cost-effective system and method for correcting three-dimensional effects on an alternating phase-shifting mask (PSM) is provided. To facilitate this correction, a method of building a library used for creating the alternating PSM can be provided. The method can include determining a first group of 180 degree phase-shifting regions, wherein the first group of 180 degree phase-shifting regions have a common first size. Three-dimensional (3D) simulation can be performed based on this first size. Of importance, a transmission and a phase can be altered in a 2D simulation based on this first size until a shape dependent transmission and a shape dependent phase allow the 2D simulation to substantially match the 3D simulation. Finally, a modified first size can be chosen using the shape dependent transmission and the shape dependent phase such that a 2D simulation based on the modified first size substantially matches the 3D simulation based on the first size. The library can associate the first size with the modified first size, the shape dependent transmission, and the shape dependent phase.

This method can be repeated for a plurality of groups of 180 degree phase-shifting regions for the alternating PSM, each group of 180 degree phase-shifting regions having a common size that is a different size than any other group. The size can refer to a width, a length, a width/length combination, or an area. In one embodiment, altering a transmission and a phase in the 2D simulation includes substantially matching a Fourier spectrum for the 3D simulation with a Fourier spectrum for the 2D simulation.

A method of designing a lithographic mask using this library is also provided. The method includes placing 0 degree phase-shifting regions and 180 degree phase-shifting regions on the lithographic mask. At this point, the library of pre-corrected shifters and matching simulation information can be accessed. Any 180 degree phase-shifting region having a size referenced in the library can be replaced with a corresponding pre-corrected shifter. The method can further include performing optical proximity correction (OPC) on the 0 degree phase-shifting regions and any pre-corrected shifters on the lithographic mask. In one embodiment, OPC can be performed using the matching simulation information, thereby ensuring that the 3D compensation provided by the pre-corrected shifters is retained.

Thus, an alternating phase-shifting lithographic mask that compensates for 3D effects can include a plurality of 0 degree phase-shifting regions and a plurality of corresponding 180 degree phase-shifting regions, wherein each 180 degree phase-shifting region has a size based on its corresponding 0 degree phase-shifting region. Therefore, a first set of the 180 degree phase-shifting regions includes a first bias and a second set of the 180 degree phase-shifting regions includes a second bias, thereby selectively compensating for 3D effects caused by the 180 degree phase-shifting regions. Note that any reference to 0 and 180 degree phase-shifting regions is relative, not absolute. In other words, the difference in phase between the two phase-shifting regions is approximately 180 degrees. Thus, 3 degree phase-shifting regions and 182 degree phase-shifting regions could also be used in the methods herein described.

A system that compensates for 3D effects on an alternating PSM is provided. The system can include an input interface for receiving a layout of the alternating phase-shifting mask and an output interface for providing a modified layout that compensates for the three dimensional effects. A memory in the system can also include a plurality of original sizes for 180 degree phase-shifting regions on the mask, a plurality of pre-corrected sizes, a plurality of transmission values, and a plurality of phase values. Each original size has a corresponding pre-corrected size, transmission value, and phase value. The corresponding transmission value and phase value allow a 2D simulation for the corresponding pre-corrected size to substantially match a three dimensional simulation for the original size. The system can further include a plurality of computer-implemented programs for generating the corresponding pre-corrected size, transmission value, and phase value. Finally, the system can include a processor for executing the plurality of computer-implemented programs.

DETAILED DESCRIPTION OF THE DRAWINGS

Figure 2:
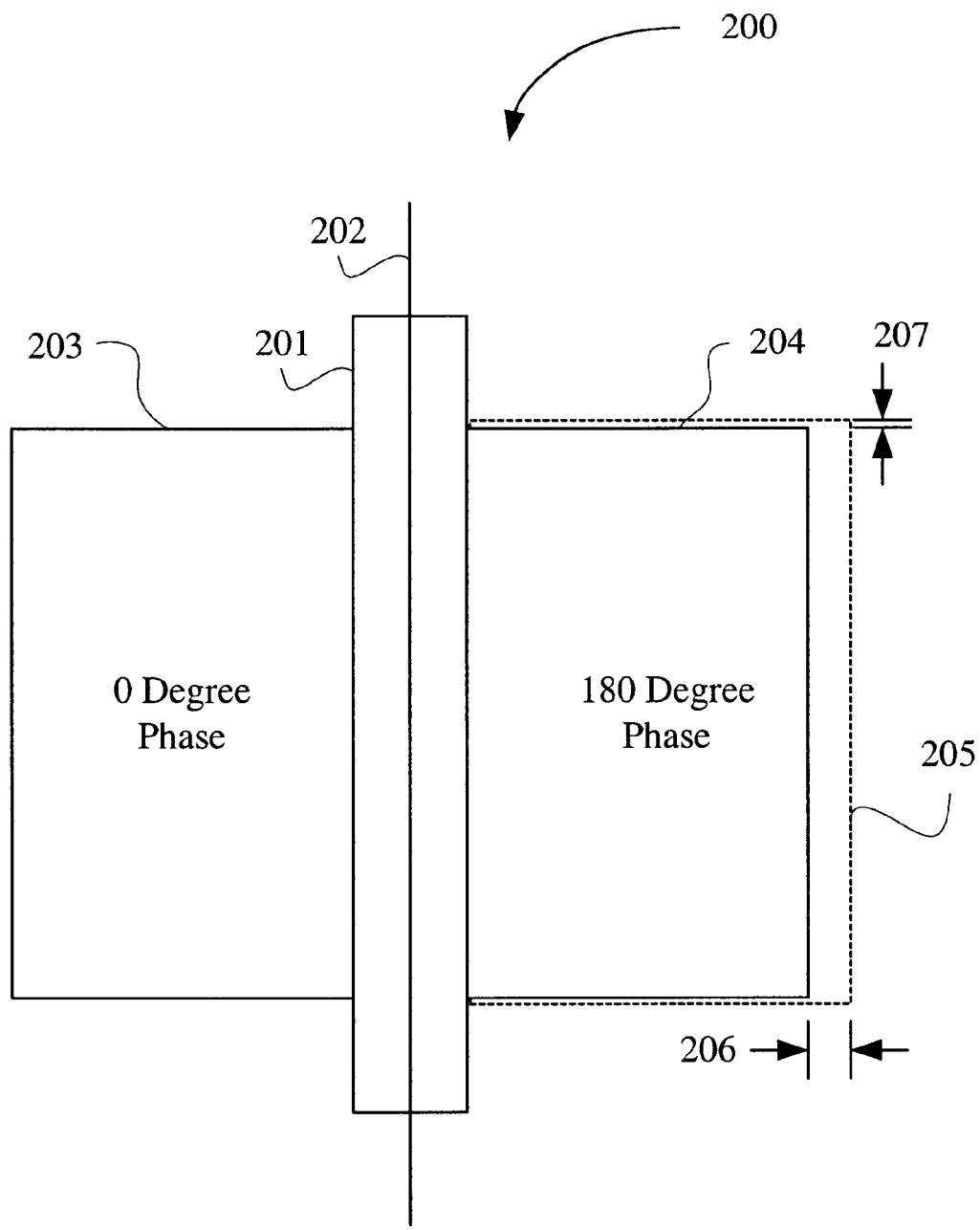
FIG. 2 illustrates an exemplary layout that can compensate for 3D effects on an alternating PSM.

To correct 3D effects while ensuring mechanical stability, a 180 degree phase-shifting region of an alternating PSM can be biased a predetermined amount larger than its corresponding 0 degree phase-shifting region. For example, FIG. 2 illustrates an exemplary layout 200. Layout 200 could be in, for example, a GDS-II format or any other format providing feature information regarding one or more layers of an integrated circuit. In this simplified layout, a feature 201, e.g. a transistor gate, has an associated 0 degree phase-shifting region 203 and an associated 180 degree phase-shifting region 204. To ensure that feature 201 prints on a wafer consistent with centerline 202, the width (i.e. the dimension perpendicular of center line 202) of 180 degree phase-shifting region 204 can be increased by a bias 206. In one embodiment, the length (i.e. the dimension parallel to center line 202) of 180 degree phase-shifting region 204 can also be increased by a bias 207, wherein bias 206 could be equal to or unequal to bias 207. Therefore, an alternating PSM used for printing feature 201 could include 0 degree phase-shifting region 203 and a revised 180 degree phase-shifting region 204, i.e. 180 degree phase-shifting region 205.

Note that providing a general bias, i.e. an identical bias to all 180 degree phase-shifting regions on the mask, can increase the intensity of some 180 degree phase-shifting regions. However, as determined by Numerical Technologies, Inc., different sized phase-shifting regions and/or phase-shifting regions in specific orientations may require different biases to optimize intensity compensation. Therefore, in accordance with one feature of the invention, the bias can be selectively provided for each 180 degree phase-shifting region based on a simulation process described in reference to FIG. 3. Selectively providing a custom bias to each 180 degree phase-shifting region can dramatically improve the ability to match the intensity of that 180 degree phase-shifting region to its associated 0 degree phase-shifting region. Note, however, that the approach could be applied to all phase-shifting regions as appropriate (e.g. if 60 degree and 240 degree phase-shifting regions were being used, then both might be compensated to have equal intensity). For simplicity of discussion, shifters of phase 0 and 180 will be considered as they are most commonly used. However, the methods described herein can be used with shifters having other phase values.

The calculation of an appropriate bias can be performed using 3D simulation. However, determining the propagation of an electromagnetic field in a mask involves rigorous calculations. Specifically, these calculations solve Maxwell equations in three dimensions and then provide the calculated wave field to image formation software. Unfortunately, an accurate 3D simulation used repeatedly in any process would be extremely resource intensive, e.g. requiring significant CPU and memory resources, and time consuming, thereby rendering the process commercially unviable.

Therefore, in accordance with one feature of the invention, the use of 3D simulation is limited to obtaining accurate information regarding a 180 degree phase-shifting area on a one time basis. Thereafter, information derived from this 3D simulation can be used in a 2D simulation to closely approximate 3D accuracy. In one embodiment, to provide a commercially viable process, an equivalency library can be built that includes an original size, e.g. width and/or length, of a 180 degree phase-shifting region as generated by PSM tools and a corresponding shifter size to actually achieve the desired printed image. (Note that a phase-shifting region is also referenced herein as a "shifter".)

Figure 1A:
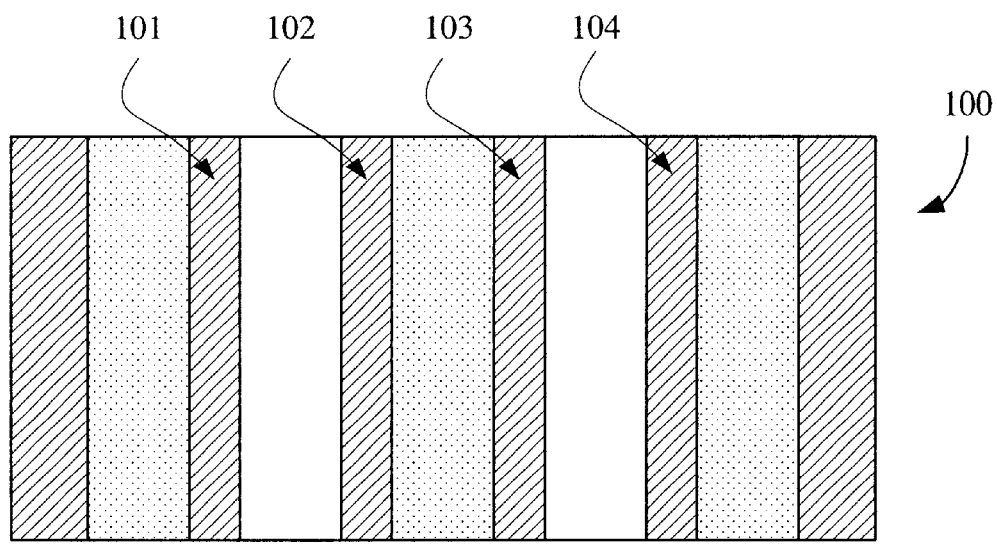
FIG. 1A illustrates a top view of an alternating PSM including closely spaced opaque features formed on a transparent substrate.
Figure 1B:
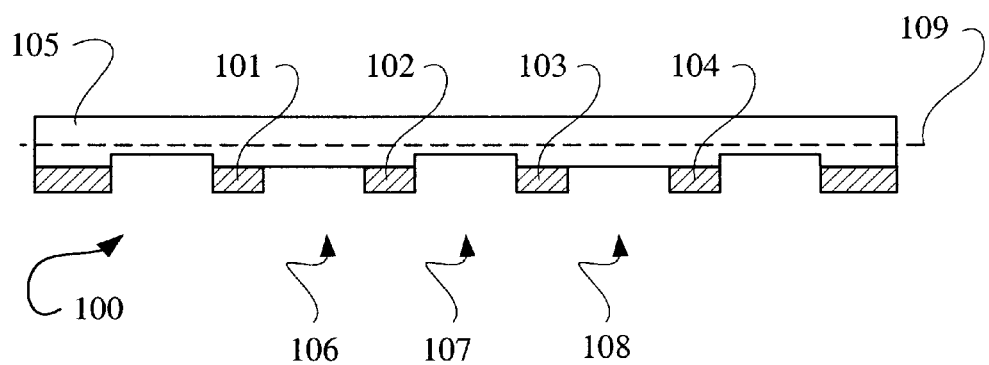
FIG. 1B illustrates a cross sectional view of the alternating PSM of FIG. 1A.
Figure 1C:
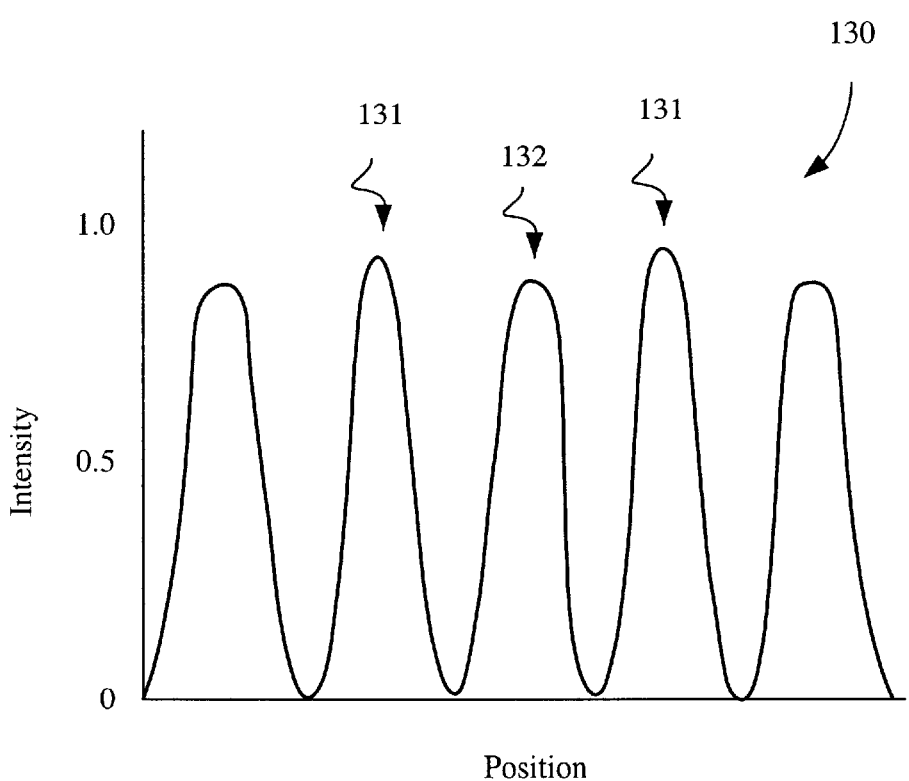
FIG. 1C illustrates a graph that plots intensity (0 to 1.0) versus position on the alternating PSM of FIGS. 1A and 1B.
Figure 1D:
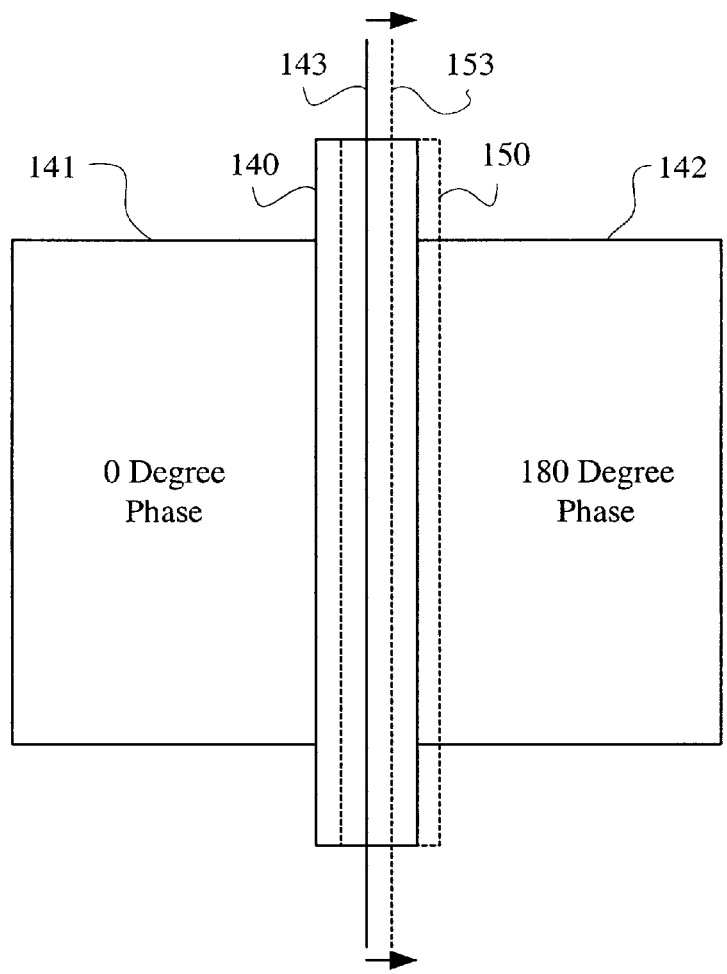
FIG. 1D illustrates a feature having a corresponding 0 degree phase-shifting region placed relative to one side of the feature and a corresponding 180 degree phase-shifting region placed relative to the other side of the feature.
Figure 1E:
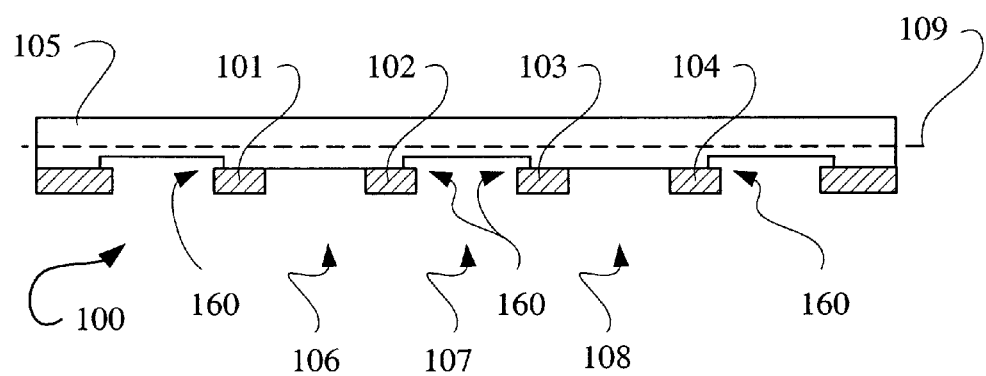
FIG. 1E illustrates a cross sectional view of an alternating PSM in which an additional etching step under-cuts certain features.
Figure 3:
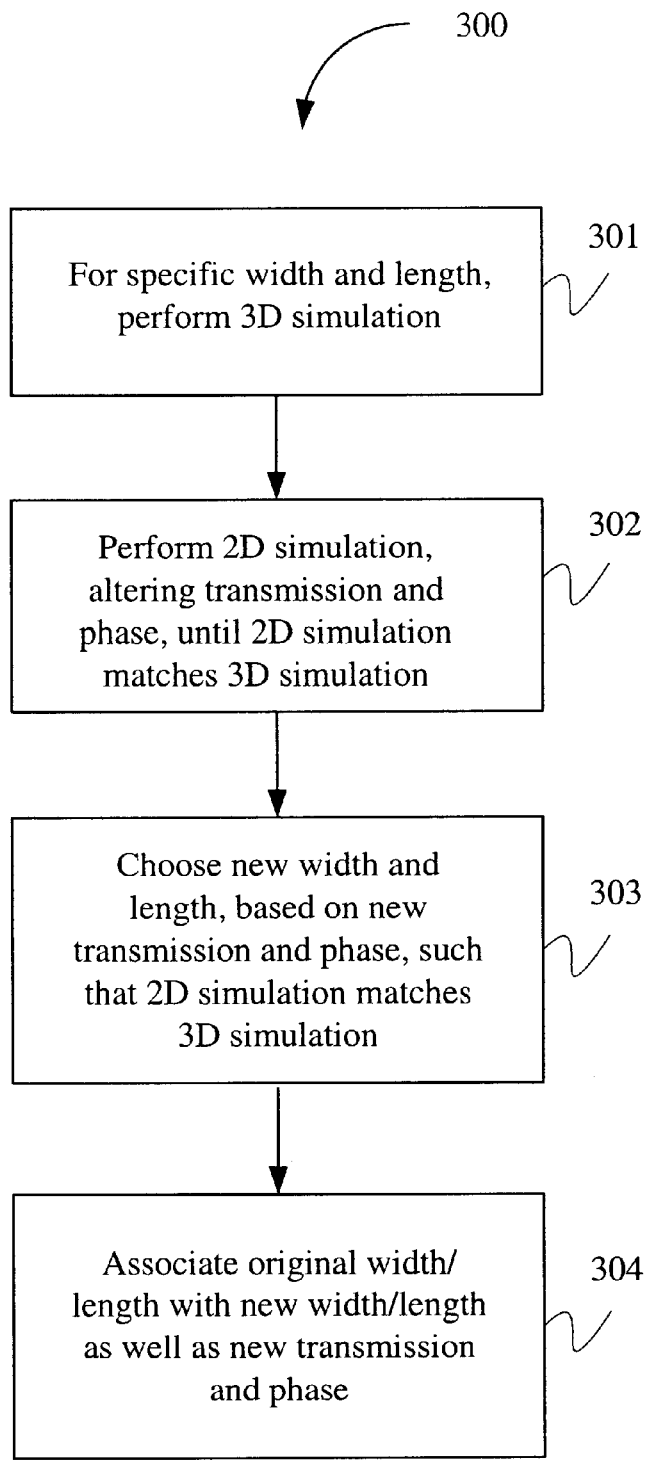
FIG. 3 illustrates a flow chart of a process for building an equivalency library.

FIG. 3 illustrates a flow chart of a process 300 for building an equivalency library. Initially, a 3D simulation can be generated for an original width and length of a shifter, i.e. $w_0$ and $l_0$, in step 301. In a preferred embodiment, the electromagnetic field calculations of this 3D simulation are performed at a cut-line on the mask that is located just below the shallow trench that forms the 180 degree phase-shifting region, e.g. approximately 50 nm, below the absorbing layer. FIG. 1B illustrates a cut-line 109 located just below the trench forming the 180 degree phase-shifting region, i.e. aperture 107. Note that calculations performed at cut-lines below this level can break down due to cross-talk between adjacent regions. Therefore, in one embodiment, a Fourier spectrum can be generated for the 3D simulated shifter at this cut-line.

Note that in this 3D simulation a transmission $T_0$ of 1 and a phase $\Phi_0$ of 180 degrees can be assumed. Performing 2D simulation on the same width/length shifter using transmission $T_0$ and phase $\Phi_0$ typically yields a slightly different Fourier spectrum. An elegant method to compensate for this variation from the 3D simulation is to alter the transmission and phase. Specifically, in step 302, 2D simulation can be performed while altering the transmission and phase until the 2D simulation substantially matches the 3D simulation. In one embodiment, to determine a match of the Fourier spectrums for the 3D and 2D simulations, either linear correlation or linear regression can be performed, both of which are well known in the art. The shape dependent transmission $T_F$ and phase $\Phi_F$ provide the necessary correction such that a 2D simulation can be performed with the same accuracy as a 3D simulation.

Specifically, using shape dependent transmission $T_F$ and phase $\Phi_F$ in step 303, a shape dependent shifter width and length, i.e. $w_F$ and $l_F$, can be chosen such that the Fourier spectrum from this shifter using 2D simulation matches the Fourier spectrum from the original shifter, i.e. having $w_0$ and $l_0$, using 3D simulation. The shape dependent shifter width $w_F$ subtracted from the original shifter width $w_0$ is called the width bias, whereas the shape dependent shifter length $l_F$ subtracted from the original shifter length $l_0$ is called the length bias. In step 304, these biases and the shape dependent transmission $T_F$ and phase $\Phi_F$ can be associated with the original shifter width $w_0$ and length $l_0$ in the equivalency library. In one embodiment, the shape dependent width $w_F$ and length $l_F$ can be used instead of the biases or in addition to the biases.

In one embodiment for building the equivalency library, the 180 degree phase-shifting regions having the same width/length can be identified on the alternating PSM. Then, the above-described process 300 can be repeated for each width/length combination, which could number in the hundreds or even thousands. In one embodiment, the shifter widths/lengths can be replaced with shifter areas (i.e. not including specific widths and lengths, but instead the total areas associated with the shifters), thereby potentially reducing the number of simulations to be performed. Note that using shifter areas instead of shifter widths/lengths can address the issue of irregular-shaped shifters, i.e. those shifters having other than four edges.

Of importance, the most resource intensive (and thus expensive) as well as time-consuming step, i.e. step 301 of generating the 3D simulation, is only done once for each width/length shifter. The subsequent steps 302 and 303, which are performed using 2D simulation, can be performed inexpensively and quickly. Additionally, once steps 301–304 in process 300 are performed, the stored information in the equivalency library can be used for any alternating PSM mask generated using similar processes. Thus, as described in further detail below, the invention also advantageously provides a layout-independent process that can accurately compensate for 3D effects during alternating PSM design.

Figure 4A:
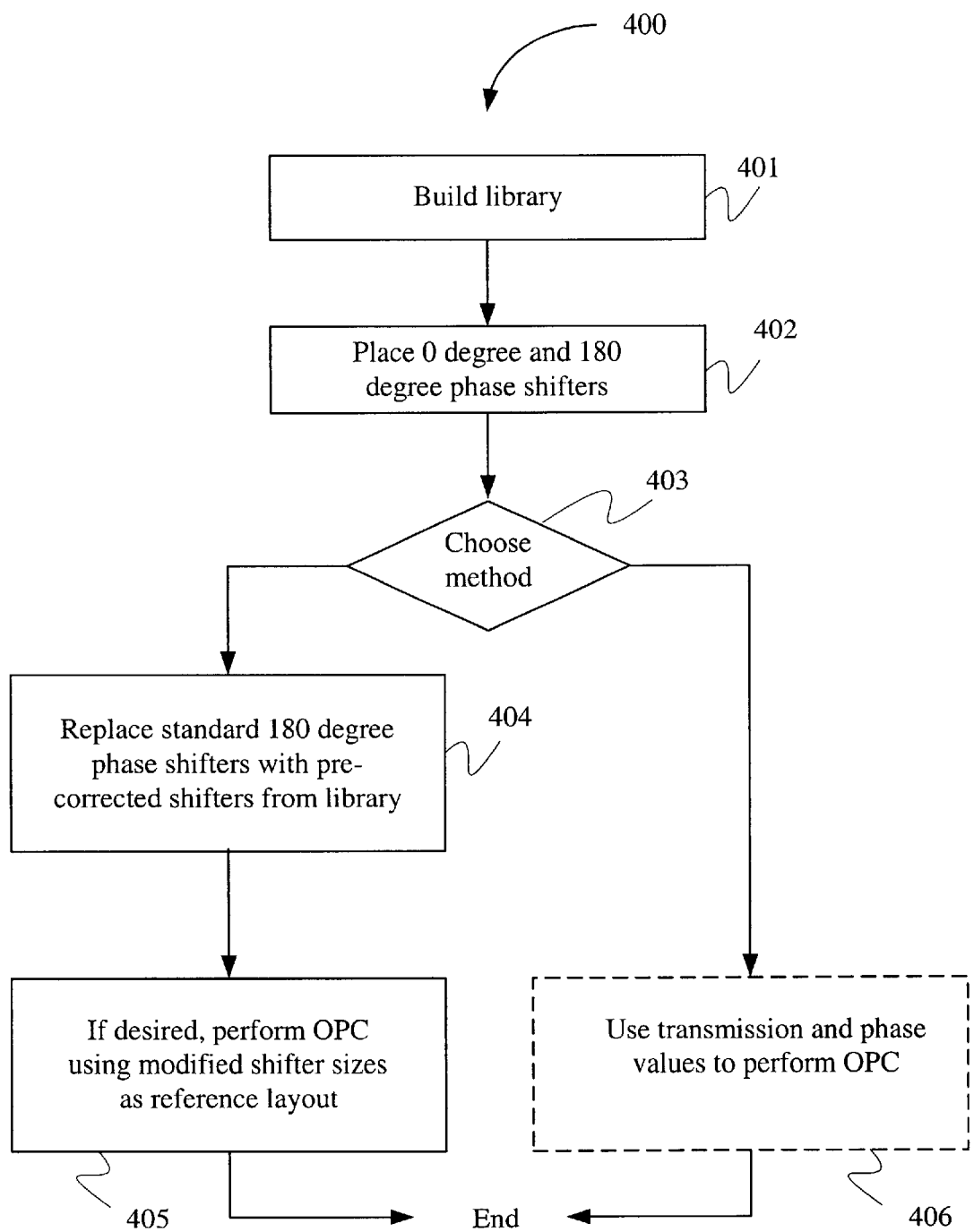
FIG. 4A illustrates a flowchart of an alternating PSM design process.

FIG. 4A illustrates a flowchart of a PSM design process 400 in accordance with one embodiment. In step 401, the equivalency library can be built using process 300 (FIG. 3). In step 402, a standard PSM process can be used to place pairs of phase-shifting regions, wherein each pair includes a 0 degree phase-shifting region and a 180 degree phase-shifting region, in operative relation to corresponding critical features (see FIG. 2). In one embodiment, a software tool, such as the iN-Phase™ tool licensed by the assignee of the invention, can be used to identify the critical features in a GDS-II file, generate a binary mask layout including a set of these critical features, and generate a PSM layout that places non-conflicting 0 degree phase-shifting regions and 180 degree phase-shifting regions in operative relation to the set of critical features. Note that the equivalency library is equally applicable to any process and/or software than can identify the (180 degree) phase-shifting regions on a mask.

Any one of multiple methods can be used to correct 3D effects, as indicated by step 403. Using one method, in step 404, the currently placed 180 degree phase-shifting regions can be replaced with the pre-corrected 180 degree phase-shifting regions stored in the equivalency library. Thus, for example, all 180 degree phase-shifting regions of width $w_0$ and length $l_0$ can be replaced with 180 degree phase-shifting regions of width $w_F$ and length $l_F$. In one embodiment, a pre-corrected shifter is chosen and all currently placed 180 degree phase-shifting regions on the mask are examined to determine if one or more of these currently placed shifters should be replaced. If replacement occurs, then these shifters need not be examined when the next pre-corrected shifter is chosen. In another embodiment, each currently placed 180 degree phase-shifting region is chosen and the library is queried whether a pre-corrected shifter exists for that width/length phase-shifting region.

Once replacement is complete, if desired, standard OPC, e.g. either rule- or model-based, can be performed in step 405 using the pre-corrected (i.e. modified) shifters as the reference layout. Note that standard OPC using 2D simulations to make the corrections can now be used.

Figure 4B:
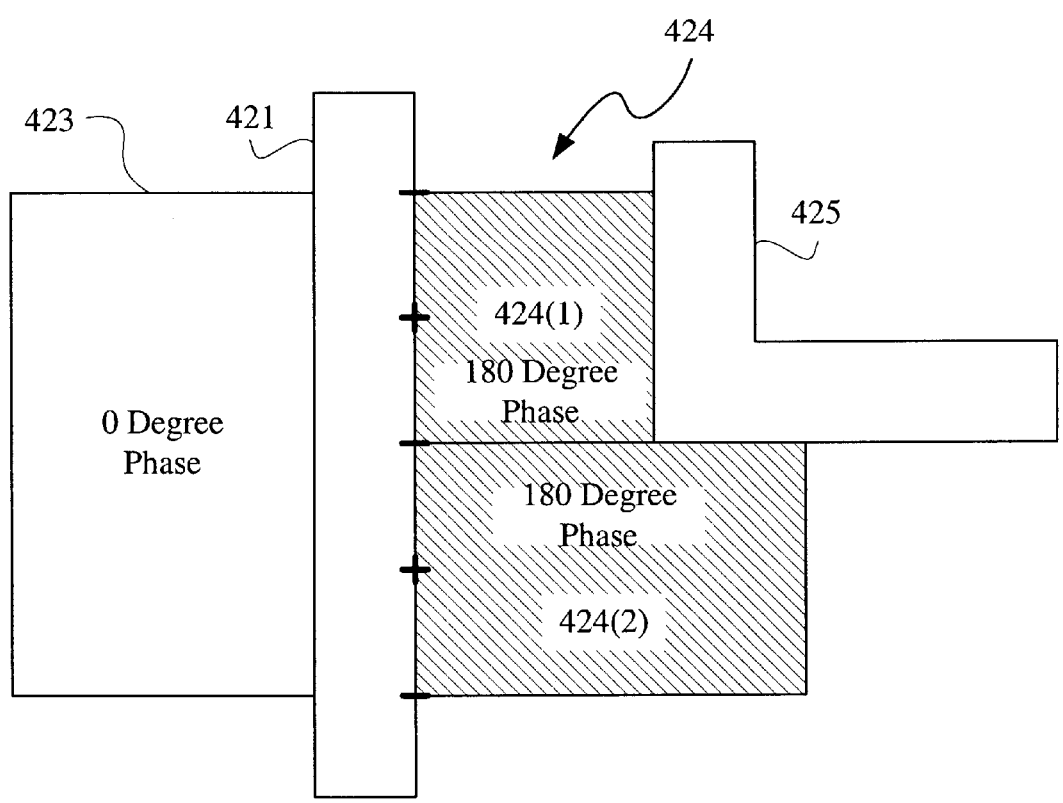
FIG. 4B illustrates an exemplary 180 degree phase shifting region including a first portion having a first transmission as well as a second portion having a second transmission.

In another method, as indicated in step 406, the shape dependent transmission $T_F$ and phase $\Phi_F$ can be used to perform the OPC on the phase mask while initially retaining the shifters placed in step 402. Specifically, instead of pre-biasing the 180 degree phase-shifting regions on the phase-shifting mask and performing standard OPC, OPC can be performed while using the appropriate shape dependent transmissions $T_F$ and phases $\Phi_F$. For example, referring to FIG. 4B, a feature 421, e.g. a transistor gate, has an associated 0 degree phase-shifting region 423 and an associated 180 degree phase-shifting region 424. To ensure that feature 421 prints on a wafer with the appropriate CD control and positioning relative to the rest of the layout, e.g. including the feature 425, OPC can be performed on the phase-shifting regions 423 and 424. As shown in FIG. 4B, this approach can even work when the shifter is not a rectangle.

In accordance with one feature of the invention, multiple phases and transmissions can be associated with any shifter. Thus, for example in FIG. 4B, 180 degree phase shifting region 424 can include a first portion 424(1) having a first transmission as well as a second portion 424(2) having a second transmission.

Model-based OPC of phase shifting region 424 along the edge that abuts feature 421 will now be considered. For illustrative purposes, dissection points (indicated by a thick dashes) and evaluation points (indicated by thick plus signs) that will be used during the OPC process are shown along the edge. Separate phase and transmission information for the phase shifting regions 424(1) and 424(2) can be provided in the equivalency library. Note that such a library can be built using steps 301–304 (FIG. 3) for each portion associated with a 180 degree phase shifting region. In one embodiment, the library is constructed in part concurrently with the OPC process of step 406. Thus, as dissection points are placed along shifters, the shifter shapes, e.g. phase shifting regions 424(1) and 424(2), are run through the process of FIG. 3. This may be useful because a single phase shifting region, e.g. the phase shifting region 424, could be divided into any number of different shaped rectangles.

Continuing the example, as model based OPC is performed on the phase shifting region 424(1), the shape dependent transmission and phase $T_F$ and $\Phi_F$, respectively, can be used in the 2D simulation to compute optical effects and adjust the shape of the phase shifting region 424(1).

Note that any 2D simulation performed after step 302 can advantageously use the shape dependent transmission $T_F$ and phase $\Phi_F$ to provide more accurate results. Thus, by using process 300, tools that perform 2D simulation can be appropriately modified to provide 3D accuracy.

Figure 5:
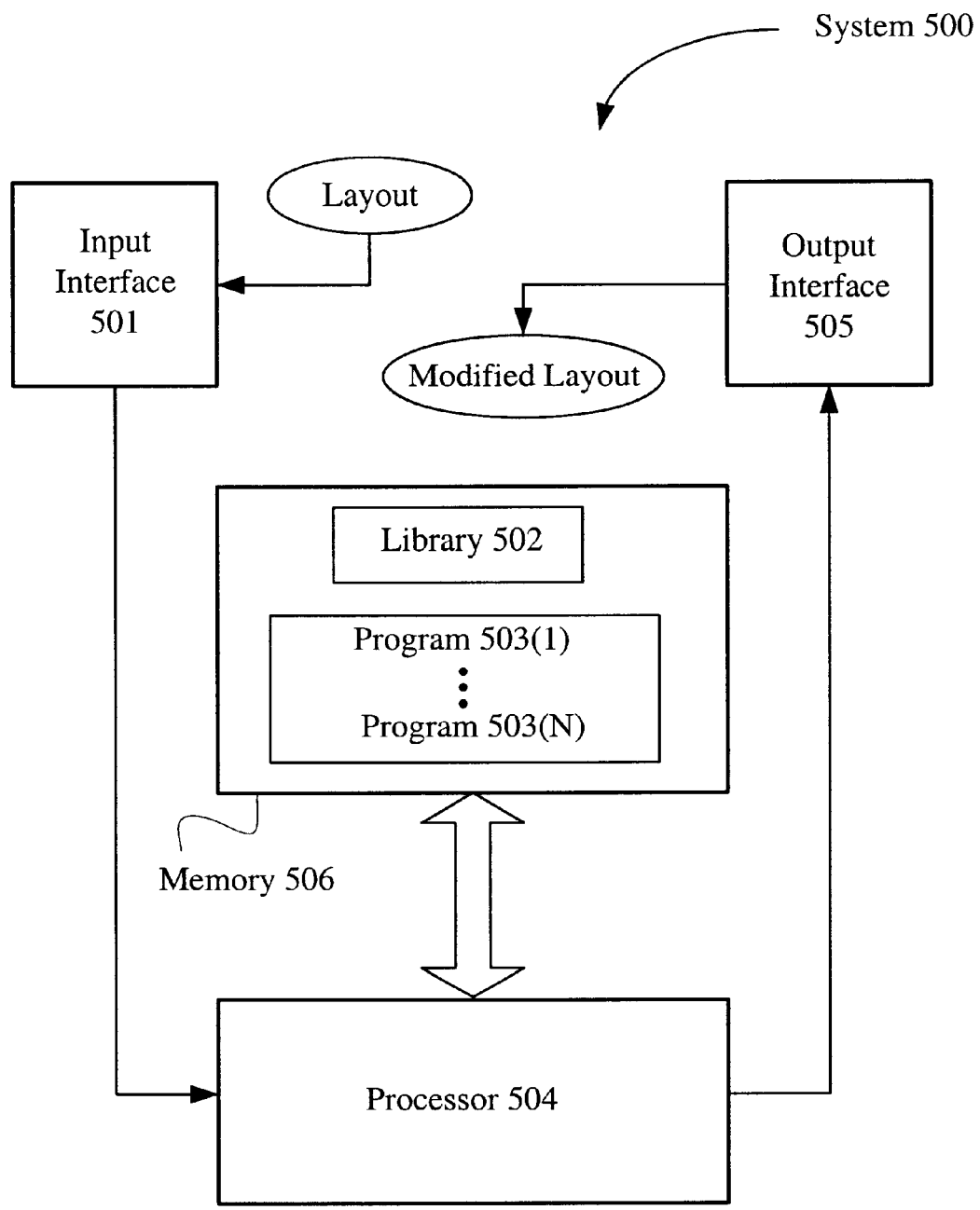
FIG. 5 illustrates a system that can compensate for 3D effects on an alternating PSM.

FIG. 5 illustrates a system 500 that can compensate for 3D effects on an alternating PSM. In one embodiment, system 500 can include an input interface 501 for receiving a layout of the alternating PSM and an output interface 505 for providing a modified layout that compensates for the three dimensional effects. System 500 can also include a memory 506 that stores an equivalency library 502 as well as a plurality of computer-implemented programs 503(1)–503(N) for implementing the steps described in FIGS. 3 and 4. In a typical embodiment, system 500 can further include a processor 504 for executing computer-implemented programs 503 and accessing library 502 as appropriate. Note that computer-implemented programs 503 can be run on any number of computer platforms including: a PC using the Windows 95™ or NT™ 4.0 operating system with 128 MB of RAM and a 200 MHz Pentium Pro™ microprocessor, either stand alone or connected to a network, and a SUN™ workstation computer among others.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. For example, in one embodiment, rather than using a 3D simulation as part of process 300 (FIG. 3), measurements from a test exposure can be used to develop the appropriate shifters. In this embodiment, the actual test exposure measurements for a given test pattern can be compared with the 2D simulation values. Adjustments can be made to the shifter until the 2D simulation values match the test exposure. Note that the methods described herein can be applied to a variety of lithographic process technologies, including ultraviolet, deep ultraviolet (DUV), extreme ultraviolet (EUV), x-ray, and ebeam. Accordingly, it is intended that the scope of the invention be defined by the following Claims and their equivalents.

What is claimed is:

1. A method of building a library used for correcting intensity imbalance in an alternating phase-shifting mask, the method comprising:

determining a first group of 180 degree phase-shifting regions for the alternating phase-shifting mask, the first group of 180 degree phase-shifting regions having a common first size;

performing a three dimensional (3D) simulation based on the first size;

performing a two dimensional (2D) simulation based on the first size;

altering a transmission and a phase in the 2D simulation until a shape dependent transmission and a shape dependent phase allow the 2D simulation to substantially match the 3D simulation;

associating the first size with the shape dependent transmission and the shape dependent phase in the library;

choosing a modified first size of a 180 degree phase-shifting region using the shape dependent transmission and the shape dependent phase such that a 2D simulation based on the modified first size substantially matches the 3D simulation based on the first size;

associating the modified first size with the first size in the library; and optionally, performing an optical proximity correction of the phase-shifting mask using phase shifters replaced according to the library such that the optical proximity correction is performed on phase shifters corrected for intensity imbalance.

2. The method of claim 1, further including repeating the steps of claim 1 for a plurality of groups of 180 degree phase-shifting regions for the alternating phase-shifting mask, each group of 180 degree phase-shifting regions having a common size that is a different size than any other group.

3. The method of claim 1, wherein size refers to at least one of width and length of the 180 degree phase-shifting region.

4. The method of claim 1, wherein performing the 3D simulation includes performing electromagnetic field calculations at a cut-line on the alternating phase-shifting mask just below a trench forming any 180 degree phase-shifting region.

5. The method of claim 4, wherein the cut-line is located approximately 50 nm below an absorbing layer on the alternating phase-shifting mask.

6. The method of claim 1, wherein altering a transmission and a phase in the 2D simulation includes substantially matching a Fourier spectrum for the 3D simulation with a Fourier spectrum for the 2D simulation.

7. The method of claim 6, wherein matching includes performing at least one of linear correlation and linear regression.

8. A library used for correcting intensity imbalance in an alternating phase-shifting mask, thereby compensating for three dimensional effects, the library comprising:
   a plurality of original sizes for 180 degree phase-shifting regions on the alternating phase-shifting mask;
   a plurality of pre-corrected sizes;
   a plurality of transmission values; and
   a plurality of phase values, wherein each original size has a corresponding pre-corrected size, a corresponding transmission value, and a corresponding phase value, and wherein the corresponding transmission value and the corresponding phase value allow a two dimensional simulation for the corresponding pre-corrected size to substantially match a three dimensional simulation for the original size; and
   optionally, an optical proximity correction of the phase-shifting mask using phase shifters replaced according to the library such that the optical proximity correction is performed on phase shifters corrected for intensity imbalance.

9. A method of designing a lithographic mask that corrects for intensity imbalance, the method comprising:
   placing 0 degree phase-shifting regions and 180 degree phase-shifting regions on the lithographic mask;
   accessing a library of pre-corrected shifters, wherein each pre-corrected shifter references a size of an original 180 degree phase-shifting region and matching 3D simulation information;
   replacing any 180 degree phase-shifting region with a pre-corrected shifter if that 180 degree phase-shifting region has a size referenced in the library; and
   optionally, performing an optical proximity correction of the lithographic mask using phase shifters replaced according to the library such that the optical proximity correction is performed on phase shifters corrected for intensity imbalance.

10. The method of claim 9, wherein the matching simulation information includes a transmission and a phase, and wherein by using the transmission and the phase, a two-dimensional simulation of the pre-corrected shifter substantially matches a three-dimensional simulation of the original 180 degree phase-shifting region.

11. The method of claim 9, further including performing optical proximity correction on the 0 degree phase-shifting regions and any pre-corrected 180 degree phase-shifting regions on the lithographic mask.

12. The method of claim 9, further including performing optical proximity correction including the matching simulation information on the 0 degree phase-shifting regions and any pre-corrected 180 degree phase-shifting regions on the lithographic mask.

13. The method of claim 9, wherein the matching simulation information includes a transmission and a phase, and wherein by using the transmission and the phase, a two-dimensional simulation of the pre-corrected shifter substantially matches a three-dimensional simulation of the original 180 degree phase-shifting region.

14. The method of claim 9, further including performing a verification simulation including the matching simulation information.

15. A method of performing optical proximity correction (OPC) on a layout for an alternating phase-shifting mask, the method comprising:
   identifying a first phase-shifting region and a second phase-shifting region on the layout, wherein a difference between the first phase-shifting region and the second phase-shifting region is approximately 180 degrees, and wherein the second phase-shifting region creates three dimensional effects on the alternating phase-shifting mask;
   accessing a library of pre-corrected shifters, wherein each pre-corrected shifter references a size of an original 180 degree phase-shifting region and matching simulation information;
   replacing the second phase-shifting region with a pre-corrected shifter if a size of the second phase-shifting region is provided in the library, thereby correcting for an intensity imbalance caused by the three dimensional effects; and
   performing the OPC on the pre-corrected shifter.

16. The method of claim 15, wherein performing OPC includes using the matching simulation information on the pre-corrected shifter.

17. A computer program product for correcting intensity imbalance in an alternating phase-shifting mask, the computer program product comprising:
   a first set of instructions for determining a first group of 180 degree phase-shifting regions for the alternating phase-shifting mask, the first group of 180 degree phase-shifting regions having a common first size;
   a second set of instructions for performing a three-dimensional (3D) simulation based on the first size;
   a third set of instructions for performing a two-dimensional (2D) simulation based on the first size;
   a fourth set of instructions for altering a transmission and a phase in the 2D simulation until a shape dependent transmission and a shape dependent phase allow the 2D simulation to substantially match the 3D simulation;
   a fifth set of instructions for choosing a modified first size of a 180 degree phase-shifting region using the shape dependent transmission and the shape dependent phase such that a 2D simulation based on the modified first size substantially matches the 3D simulation based on the first size; and
   a sixth set of instructions for associating the first size, the modified first size, the shape dependent transmission, and the shape dependent phase; and
   optionally, a seventh set of instructions for performing an optical proximity correction of the phase-shifting mask using phase shifters replaced according to the library such that the optical proximity correction is performed on phase shifters corrected for intensity imbalance.

18. The computer program product of claim 17, further including an eighth set of instructions for repeating the steps of claim 17 for a plurality of groups of 180 degree phase-shifting regions for the alternating phase-shifting mask, each group of 180 degree phase-shifting regions having a common size that is a different size than any other group.

19. The computer program product of claim 17, wherein the second set of instructions includes instructions for performing electromagnetic field calculations at a cut-line on the alternating phase-shifting mask just below a trench forming any 180 degree phase-shifting region.

20. The computer program product of claim 17, wherein the fourth set of instructions includes instructions for substantially matching a Fourier spectrum for the 3D simulation with a Fourier spectrum for the 2D simulation.

21. A method of designing a trim mask and an associated phase-shifting mask, wherein the phase-shifting mask is corrected for intensity imbalance, the method comprising:

placing 0 degree phase-shifting regions and 180 degree phase-shifting regions on the phase-shifting mask;

accessing a library of pre-corrected shifters, wherein each pre-corrected shifter references a size of an original 180 degree phase-shifting region, at least one transmission, and at least one phase, wherein by using the at least one transmission and the at least one phase, a two-dimensional simulation of the pre-corrected shifter substantially matches a three-dimensional simulation of the original 180 degree phase-shifting region;

optionally, performing optical proximity correction (OPC) on a feature on the trim mask using the at least one transmission and the at least one phase of an associated 180 degree phase-shifting region; and extending an area of the associated 180 degree phase-shifting region on the phase-shifting mask to be in operative position with the feature.

22. The method of claim 21, wherein at least one 180 degree phase-shifting region comprises a plurality of portions, wherein at least one portion has an area different than another portion.

23. The method of claim 21, wherein at least one 180 degree phase-shifting region comprises a plurality of portions, wherein at least one portion has a transmission different than another portion.

24. The method of claim 21, wherein at least one 180 degree Phase-shifting region comprises a plurality of portions, wherein at least one portion has a phase different than another portion.

* * * * *